United States Patent [19]

Hunts

[11] 4,242,667

[45] Dec. 30, 1980

[54] HIGH DENSITY PROXIMITY SWITCH ARRANGEMENT

[75] Inventor: Barney D. Hunts, Mountain Lakes, N.J.

[73] Assignee: The Singer Company, Stamford, Conn.

[21] Appl. No.: 938,626

[22] Filed: Aug. 31, 1978

[51] Int. Cl.³ .......................... G06F 3/02; D05B 3/00
[52] U.S. Cl. .......................... 340/365 R; 112/158 E; 340/365 E
[58] Field of Search ............ 340/365 R, 365 C, 365 S; 400/479.1, 485, 94, 100; 112/158 E, 121.11; 178/17 C, 79; 179/90 K; 200/5 A, DIG. 1

[56] References Cited

U.S. PATENT DOCUMENTS

| | | | |
|---|---|---|---|
| 3,225,883 | 12/1965 | Ayres | 340/365 R |
| 3,872,808 | 3/1975 | Wurst | 112/158 E |
| 4,042,777 | 8/1977 | Bequaert | 340/365 R |
| 4,055,129 | 10/1977 | Hunts et al. | 112/158 E |
| 4,157,539 | 6/1979 | Hunts et al. | 340/365 C |
| 4,161,918 | 7/1979 | Dunn | 112/158 E |

OTHER PUBLICATIONS

IBM Technical Disclosure, Lubart et al., Mar. 1979, pp. 3904-3906.

*Primary Examiner*—James J. Groody
*Attorney, Agent, or Firm*—Edward P. Schmidt; Robert E. Smith; Edward L. Bell

[57] ABSTRACT

A proximity switch arrangement for an appliance having a multiplicity of operating capabilities, functions and conditions which are selected or adjusted through actuation of proximity switches by the presence of an operator's finger. Indicia representative of the operating capabilities, functions and conditions of the appliance are provided on a display panel. A plurality of proximity pads, which are interconnected in several groups, are arranged with respect to the indicia in the display so as to have a pair of pads from separate groups unique for each indicium and closely adjacent each side of the indicium. When an operator touches an indicium on the display, the proximity pads on each side of the indicium are actuated and by means of a decoder the unique indicium designated by the unique pair of groups of proximity switches is determined. Furthermore, the arrangement of the proximity pads are such that nearly every pad has an indicium on either side of it. As a result, each pad effectively becomes part of two switch devices. It is this dual role performed by each pad that permits the high density arrangement.

2 Claims, 6 Drawing Figures

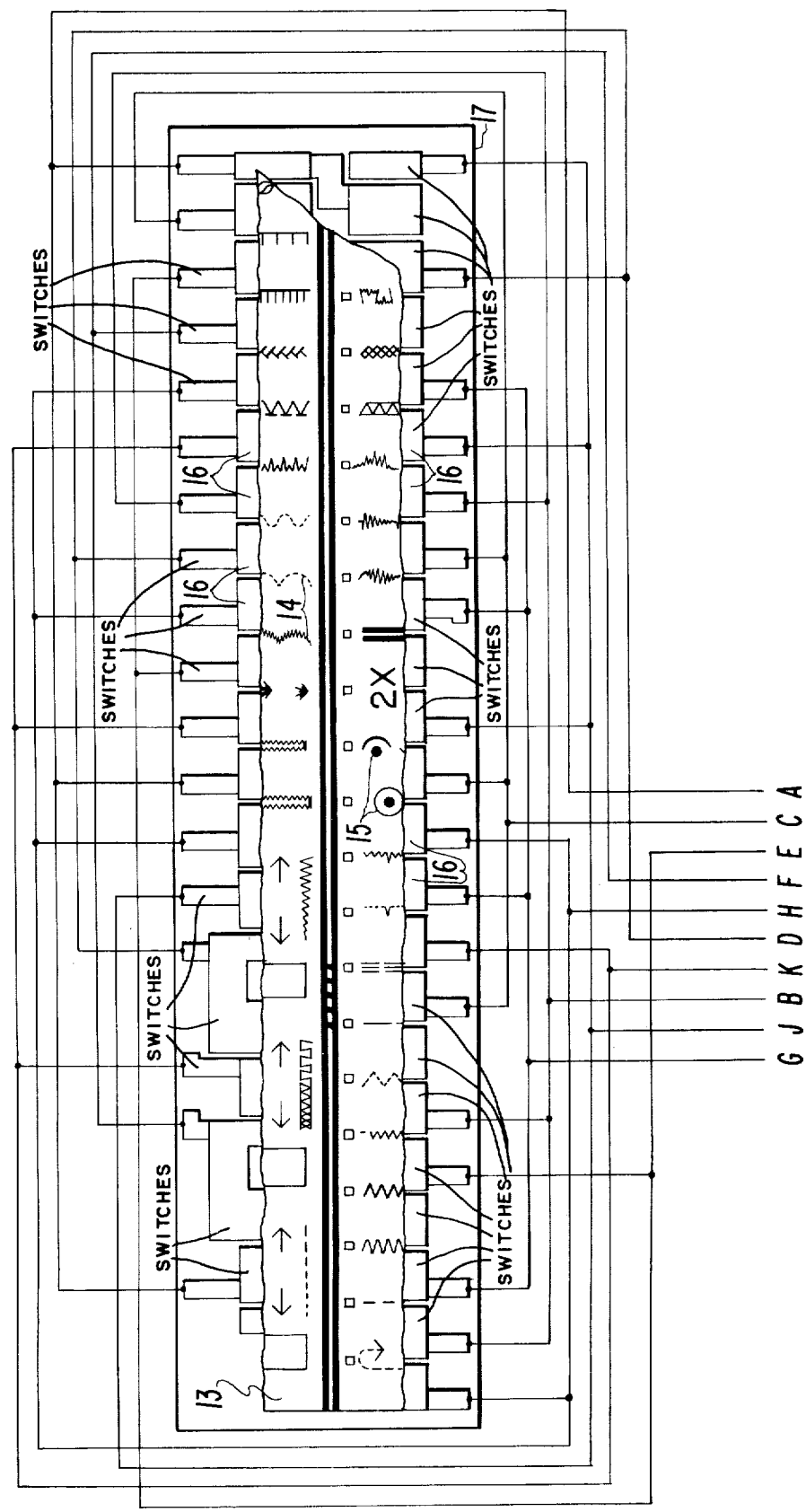

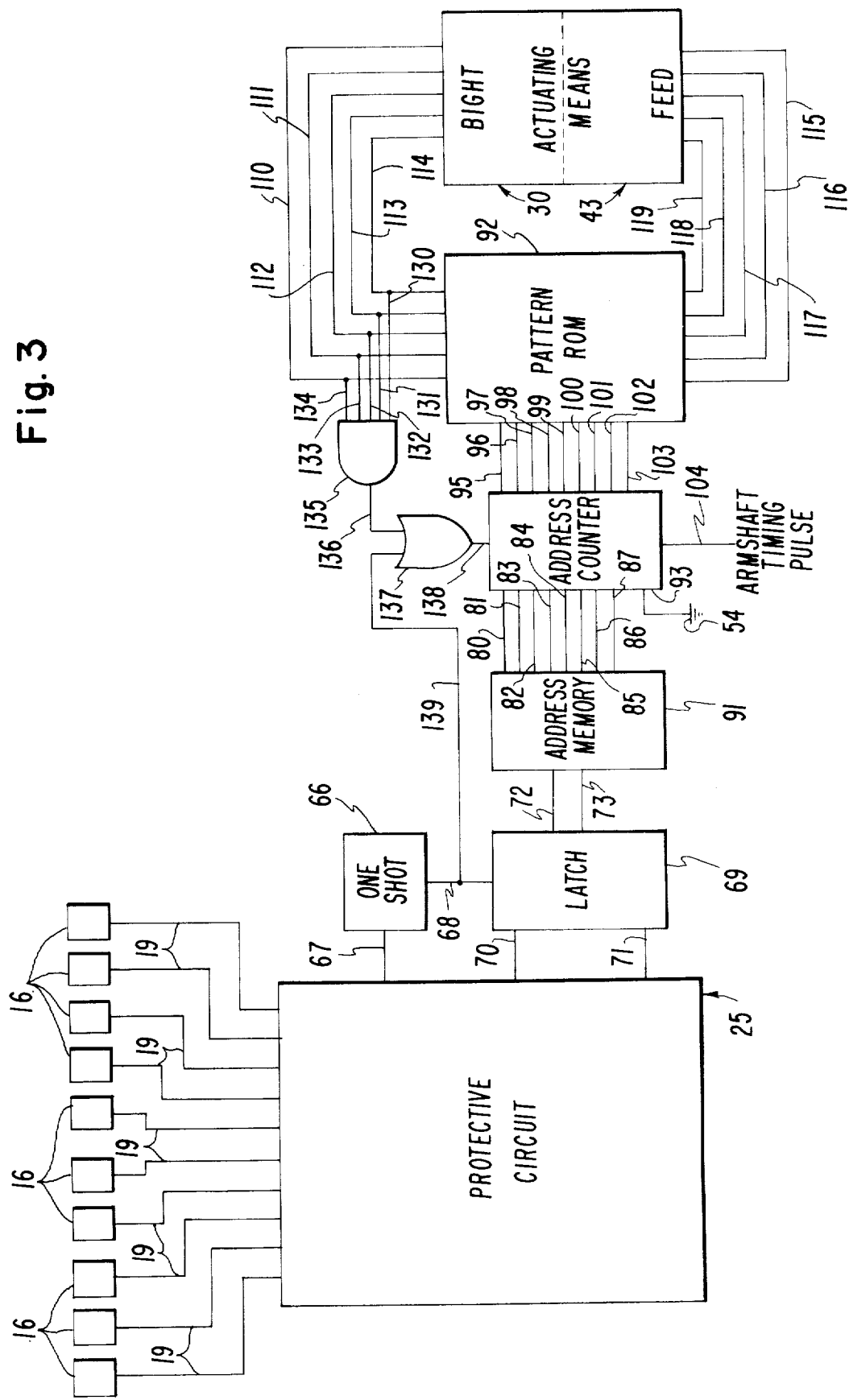

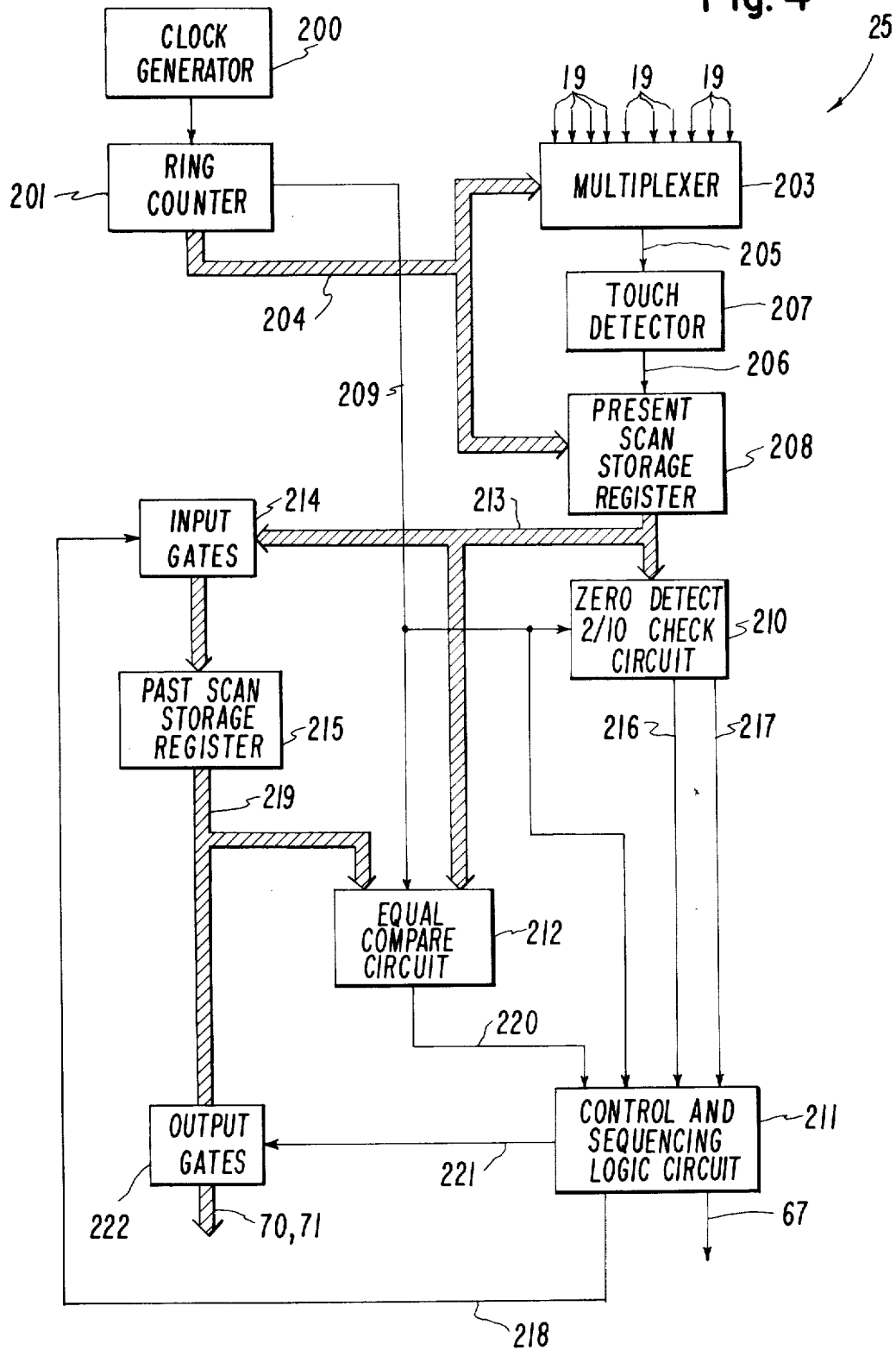

HIGH DENSITY PROXIMITY SWITCH ARRANGEMENT

DESCRIPTION

Background of the Invention

In an appliance having a multiplicity of selectable capabilities and conditions, a means must be provided for selecting a specific capability and condition therefore. In an electronically regulated machine, the selecting means may be implemented by a switch device which may be supported in a control panel thereon. Each capability and condition may be selected by a separate switch device; which switch device may be of a variety known as a proximity switch having a proximity pad responsive to the presence of an operator's finger. However, for a machine having a very large number of selectable capabilities and conditions, it is apparent that an unduly large control panel may be necessary because of the need to separate switch devices by some minimum distance to avoid simultaneous operation of proximity pads from two or more switch devices. What is required is a switch arrangement which is compact while at the same time having the capability to accommodate a large number of selectable items.

SUMMARY OF THE INVENTION

The above requirement is achieved in an arrangement wherein ten groups of proximity pads are used to provide selection capability among up to 45 capabilities or conditions. An entire field of proximity pads is provided over which is arranged a layer carrying markings or indicia thereon representative of the capabilities and conditions of the appliance. Each indicium is arranged between a pair of proximity pads, constituting a switch device, so that a touch on an indicium will actuate two adjacent proximity pads. Therefore, a single proximity pad is located between pair of indicia; and an adjacent pair of proximity pads must be actuated for a selection. In this fashion the prior art requirement for switch device separation is eliminated. The proximity pads are interconnected in 10 groups in such a manner as to provide for a unique pair of proximity pad groups for each indicium. By suitable decoding, the unique pair of proximity pad groups may provide, for example, the address to a solid state memory to initiate a selected capability or to implement a selected condition.

DESCRIPTION OF THE DRAWINGS

In the accompanying drawings of a preferred embodiment of the invention;

FIG. 2 is an elevation of the touch control panel shown in FIG. 1 partially broken away to disclose the proximity pads beneath the front display panel and the location of the indicium midway of the pads;

FIG. 3 is a functional block diagram of an electronic stitch pattern selector system for a sewing machine showing the protective circuit of the invention applied thereto;

FIG. 4 is a functional block diagram of the protective circuit shown in FIG. 3.

DETAILED DESCRIPTION OF THE INVENTION

Figure 1:
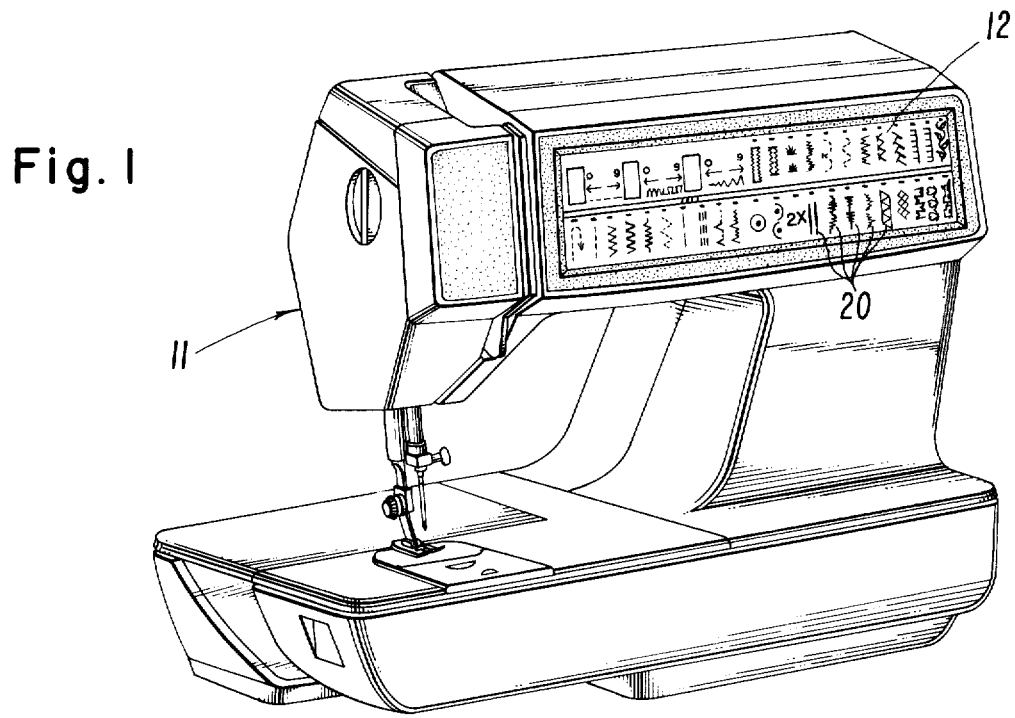
FIG. 1 is a perspective view of a sewing machine having a touch control panel of the type particularly well adapted for use with this invention.
Figure 5:
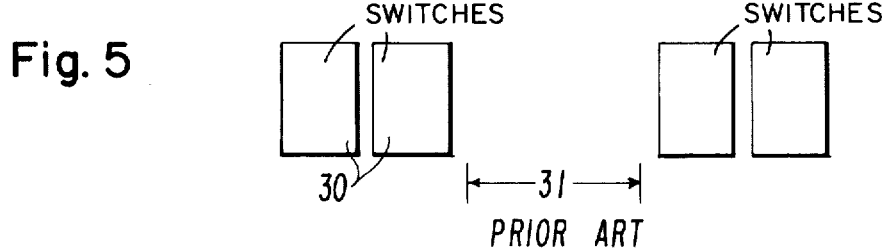
FIG. 5 is an arrangement of proximity pads as taught by the prior art.

Referring to the drawings, FIG. 1 illustrates a sewing machine indicated generally at 11 having a conical panel 12 of the type for which this invention is particularly adapted. The control panel 12 is of the type utlizing continuous planar element such as a glass panel to which circuitry is applied as by deposition or the like to provide control sensitive to the presence of an operator's finger. Indicated at 20 in FIG. 1 are a multiplicity of representations of various stitch patterns available in the electronic memory of the sewing machine 11, and preferrably the switching arrangement included on the panel is repsponsive to the operator's touch on selected areas denoted by indicia 20. Because of the magnitude of choice available by virtue of the electronic control of the stitch patterns, and because of the limited area available on the surface of a sewing machine which can be devoted to the control panel 12, it is desirable to maximize the density of the switches included on the control panel. A problem created by increasing the density of the switches in the usual fashion is that the selection are a becomes small relative to the size of an operator's finger implementing the selection. There is, therefore, a minimum physical dimension for the selection area.

Where a pair of proximity pads 30 are used to implement a selection switch, however, interswitch separation 31 is required to avoid inadvertent operation. See FIG. 5 and the U.S. patent application Ser. No. 732,228, filed on Oct. 14, 1976, now U.S. Pat. No. 4,157,539, and assigned to the same assignee as the instant invention.

Figure 6:
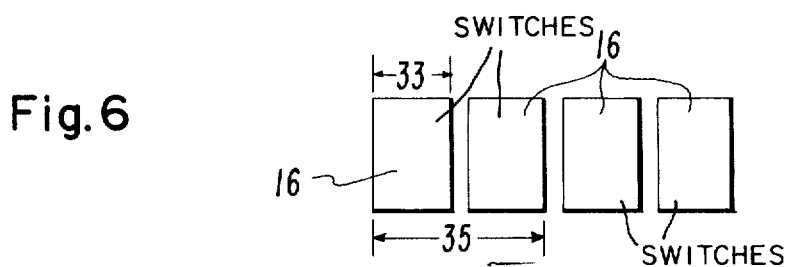
FIG. 6 is the arrangement of proximity pads taught by the invention.

The solution proposed by this invention, shown in FIG. 6, is to utilize an adjacent pair of proximity pads 16 for each selection, with each proximity pad being used in the selection of adjacent indicia. Thus, the requirement for interswitch separation is eliminated and greater switch density is obtained.

Referring to FIG. 2 there is shown in elevation of the control panel 12 shown in FIG. 1 with portions thereof removed in order to better show the detail thereof. Thus, a front composite 13 carrys thereon indicia representative of stitch patterns 14 of which the sewing machine 11 is capable, and conditions 15 indicating conditions under which sewing takes place. The front composite 13 has been cut away in sections in order to show more clearly the positioning of the indicia 14, 15 with respect to the proximity pads 16 carried on substrate layer 17. Each indicium 14, 15 is positioned centrally over a narrow gap between the proximity pads 16 so that the presence of an operator's finger on the indicium will be sensed by both proximity pads immediately adjacent thereto. Thus, it is apparent that the effective width for actuation of the proximity pads by the touch of an operator's finger has been increased from the width of one pad 33 to the approximate width of two pads 35 (See FIG. 6).

In FIG. 2 there is also shown the connection between the proximity pads 16 in order to provide 10 groups of pads any two of which will select a particular capability or condition. The cut away portion of the front composite 13 reveals how certain of the proximity pads 16 are interconnected internally on the substrate layer 17, thereby requiring a connection from one side only.

In order to show how the invention may be utilized in the sewing machine, there is shown the functional block diagram of FIG. 3 of the electronic system for the sewing machine. Reference is made to U.S. Pat. No. 3,872,808, issued on Mar. 25, 1975 to Wurst, which is assigned to the same assignee as the instant invention and is hereby incorporated by reference herein. In the U.S. Pat. No. 3,872,808, there is disclosed a sewing machine in which stitch position coordinates may be controlled electronically and in which means are provided for selecting any one of a number of different stitch patterns stored in the electronic memory. As shown in FIG. 3 each of the proximity pads 16 is connected by an input line 19 to a protective circuit 25 from which outputs on lines 67, 70 and 71 are possible to the operating logic of an electronic control for a sewing machine. In FIG. 3, reference characters 30 through 139 are those described in detail in the U.S. Pat. No. 3,872,808 incorporated herein by reference.

The protective circuit 25, which is illustrated diagrammatically in greater detail in FIG. 4, is effective to prevent selection from being made unless the switching is effected by the operator in a prescribed fashion to prevent unintended selection in the event that the operator's finger should roll onto an adjacent switch during the selection process. Referring to FIG. 4, a clock generator 200 continually steps a 12 position ring counter 201. By means of the connections 204, 205 and 206 the first ten positions of the ring counter, 201 connect in turn each of the proximity pads 16 to a touch detector 207, and the output of the touch detector 207 to the corresponding bit and a present scan storage register 208. A scan complete signal is generated by the ring counter 201 after each cycle of scanning which preferably occurs at approximately 720 microsecond intervals and the scan complete signal is applied on line 209 as an input to three circuits; a zero detect and 2 out of 10 check circuit 210; a control and sequencing logic circuit 211; and, an equal compare circuit 212.

The output of the present scan storage register 208 is delivered by connection 213 to the zero detect and 2 out of 10 check circuit 210, and also by way of input gates 214 to a past scan storage register 215. Upon receipt of the scan complete signal on the line 209, the zero detect and 2 out of 10 check circuit 210 will examine the contents of the present scan storage register 208, presented to it by the connection 213. If none of the proximity pads 16 are being touched, a signal will be generated by the zero detect circuit 210 on line 216 to the control and sequencing logic circuit 211, maintaining this logic circuit in an idle state. If a valid scan occurs, that is exactly 2 out of 10 input lines 19 are active, than a signal will be generated by the 2 out of 10 check circuit 210 on line 217 to the control and sequencing logic circuit 211, which generates a signal in line 218 to the input gates 214, admitting the contents of the present scan storage register 208 into the past scan storage register 215.

The output of the past scan storage register 215 on lines 219 along with line 213 from the present scan storage register 208 are directed to the equal compare circuit 212 and if two successive scans result in an equal valid output on lines 219, a signal will be delivered in line 220 from the equal compare circuit 212 to the control and sequencing logic circuit 211. The control and sequencing logic circuit 211 preferably is arranged such that if three successive scans of the ring counter do not result in any zero detect, all result in a valid detection in 2 out of 10 inputs on lines 19, and each of these is equal to the first, the logic circuit will generate a signal on line 221, opening output gates 222 in the line 219 and will generate a signal in the connection 67 from the logic circuit which corresponds to the line 67 shown in FIG. 3. From the output gates 222, the connection 70 and 71 correspond to the line 70 and 71 shown in FIG. 3. For greater detail relative to the above, reference may be had to the U.S. Pat. No. 4,161,918, issued July 24, 1979 to Dunn, which patent is assigned to the same assignee as the instant invention.

Thus, the outputs on line 70, 71, which are representative of the proximity pads 16 which were actuated, is retained in latch 69 to provide a continuous output from the latch on output lines 72 and 73 to the address memory 91. As stated in the above referenced U.S. Pat. No. 3,872,808, a pattern selector code word appearing on lines 72 and 73 is coupled to an address memory 91, which address memory provides on output lines 80 through 87 a code word representing the pattern selected. Thus, the address memory 91 received information relative to the specific pair of proximity pads 16 actuated in terms of the group with which each pad of the pair is associated. The address memory 91 decodes this information and provides as output a pattern selector code word called for by actuation of the specific proximity pads 16. Further operation of the electronic controls of the sewing machine may proceed as taught in the above reference patent or by any variation thereof.

Having thus set forth the invention what is sought to be claimed is:

1. A control panel for an appliance having a multiplicity of operating capabilities, functions and conditions, said control panel comprising:

means for presenting to an operator of said appliance indicia representative of said operating capabilities, functions and conditions of said appliance;

a plurality of switch devices which are interconnected in several groups and arranged with respect to said presenting means so as to have a switch device from a different switch group on each side of each indicium of said indicia, with adjacent indicia sharing a switch device, thereby to provide a unique pair of switch groups for each indicium of said indicia;

means for determining the actuation of any pair of said switch groups; and, means for decoding the specific operating capability, function and condition selected by actuation of said any pair of said switch groups.

2. A control panel as claimed in claim 1 wherein said switch devices are implemented by proximity pads, and wherein said determining means includes a device associated with said proximity pads for determining the presence of an operator's finger adjacent a pair of proximity pads from a pair of groups thereof unique for the specific indicium of said indicia closely adjacent said operator's finger.

* * * * *